(12) United States Patent
Edelstein et al.

(10) Patent No.: US 9,716,088 B1
(45) Date of Patent: Jul. 25, 2017

(54) 3D BONDED SEMICONDUCTOR STRUCTURE WITH AN EMBEDDED CAPACITOR

(71) Applicant: International Business Machines Corporation, Armonk, NY (US)

(72) Inventors: Daniel C. Edelstein, White Plains, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/199,052

(22) Filed: Jun. 30, 2016

(51) Int. Cl.
*H01L 23/522* (2006.01)
*H01L 23/00* (2006.01)
(Continued)

(52) U.S. Cl.
CPC ...... *H01L 27/0688* (2013.01); *H01L 23/5222* (2013.01); *H01L 23/5329* (2013.01); *H01L 23/53214* (2013.01); *H01L 23/53219* (2013.01); *H01L 23/53228* (2013.01); *H01L 23/53233* (2013.01); *H01L 24/27* (2013.01);
(Continued)

(58) Field of Classification Search
CPC ............ H01L 27/0688; H01L 23/5222; H01L 23/53214; H01L 23/53219; H01L 23/53228; H01L 23/53233; H01L 23/5329
USPC ........ 257/532, 737, 774, E21.088, E21.158, 257/E21.24, E29.343; 438/384, 455, 585
See application file for complete search history.

(56) References Cited

U.S. PATENT DOCUMENTS 5,503,704 A 4/1996 Bower et al.
6,291,343 B1 9/2001 Tseng et al.
(Continued)

FOREIGN PATENT DOCUMENTS

EP 1275142 1/2003
WO D161743 A1 8/2001

OTHER PUBLICATIONS

Warner, K., et al., "Low-temperature oxide-bonded three-dimensional integrated circuits," IEEE International SOI Conference, Oct. 2002, pp. 123-124.
(Continued)

*Primary Examiner* — Dao H Nguyen
(74) *Attorney, Agent, or Firm* — Scully, Scott, Murphy & Presser, P.C.; Steven J. Meyers

(57) ABSTRACT

A first semiconductor structure including a first bonding oxide layer having a first metallic structure embedded therein and a second semiconductor structure including a second bonding oxide layer having second metallic structure embedded therein are provided. A high-k dielectric material is formed on a surface of the first metallic structure. A nitride surface treatment process is performed to provide a nitrided surface layer to each structure. The nitrided surface layer includes nitridized oxide regions located in an upper portion of the bonding oxide layers and either a nitridized high-k dielectric material located in at least an upper portion of the high k dielectric material or a nitridized metallic region located in an upper portion of the second metallic structure. The nitrogen within the nitridized metallic region is then selectively removed to restore the upper portion of the second metallic structure to its original composition. Bonding is then performed.

10 Claims, 8 Drawing Sheets

(51) Int. Cl.
*H01L 25/065* (2006.01)
*H01L 27/06* (2006.01)
*H01L 23/532* (2006.01)

(52) U.S. Cl.
CPC .... *H01L 24/83* (2013.01); *H01L 2224/27848* (2013.01); *H01L 2224/8312* (2013.01); *H01L 2224/83895* (2013.01); *H01L 2224/83896* (2013.01); *H01L 2924/01013* (2013.01); *H01L 2924/01027* (2013.01); *H01L 2924/01029* (2013.01); *H01L 2924/01044* (2013.01); *H01L 2924/01045* (2013.01); *H01L 2924/01073* (2013.01); *H01L 2924/01074* (2013.01)

(56) References Cited

U.S. PATENT DOCUMENTS

| | | | |
|---|---|---|---|
| 6,720,204 | B2 | 4/2004 | Sudijono et al. |
| 8,048,728 | B2 | 11/2011 | Yamazaki |
| 8,183,127 | B2 | 5/2012 | Patti et al. |
| 8,318,586 | B2 | 11/2012 | Libralesso et al. |
| 8,318,587 | B2 | 11/2012 | Shimomura et al. |
| 8,426,256 | B2 | 4/2013 | Hsiao et al. |
| 8,647,983 | B2 | 2/2014 | Di Cioccio et al. |
| 8,921,209 | B2 | 12/2014 | Bedell et al. |
| 9,293,431 | B2 * | 3/2016 | Chang ................ H01L 23/481 |
| 9,368,566 | B2 * | 6/2016 | Lee ..................... H01L 28/40 |
| 9,496,239 | B1 | 11/2016 | Edelstein et al. |
| 2008/0224274 | A1 | 9/2008 | Yamazaki et al. |
| 2011/0101537 | A1 | 5/2011 | Barth et al. |
| 2011/0129986 | A1 | 6/2011 | Libralesso et al. |
| 2012/0126425 | A1 | 5/2012 | Farooq et al. |
| 2012/0286395 | A1 * | 11/2012 | Fischer ............... H01L 23/5223 257/532 |
| 2013/0122713 | A1 | 5/2013 | Rogers et al. |
| 2013/0164905 | A1 * | 6/2013 | Yang ................... H01L 23/5223 438/386 |
| 2014/0357093 | A1 | 12/2014 | Landru et al. |
| 2015/0108644 | A1 | 4/2015 | Kuang et al. |
| 2015/0255139 | A1 * | 9/2015 | Atsumi ............... H01L 29/7869 257/43 |
| 2016/0043060 | A1 * | 2/2016 | Kabe ................... H01L 27/0688 257/774 |
| 2016/0254248 | A1 * | 9/2016 | Shih ................... H01L 21/76805 438/107 |

OTHER PUBLICATIONS

Ventosa, C., et al., "Mechanism of thermal silicon oxide direct wafer bonding," Electrochemical and Solid-State Letters, Aug. 2009, pp. H373-H375, vol. 12, No. 10.

Eichler, M., et al., "Effects on silanol condensation during low temperature silicon fusion bonding," Journal of the Electrochemical Society, Aug. 2009, pp. H786-H793, vol. 156, 10.

Chua, S. L., et al., "Direct copper-copper wafer bonding with Ar/N2 plasma activation," International Conference on Electron Devices and Solid-State Circuits, Jun. 2015, pp. 134-137.

Tan, C. S., et al., "Low Temperature Wafer Bonding of Low-κ Carbon-Doped Oxide for Application in 3D Integration," Electrochemical and Solid-State Letters, vol. 13, No. 2, Nov. 2010, pp. H27-H29.

Di Cioccio, L., et al., "An innovative die to wafer 3D integration scheme: Die to wafer oxide or copper direct bonding with planarised oxide inter-die filling," International Conference on 3D System Integration, Sep. 2009, 3DIC, 4 pages.

List of IBM Patents or Patent Applications Treated as Related Filed Jun. 30, 2016, 2 Pages.

Notice of Allowance dated Dec. 2, 2016 received in U.S. Appl. No. 15/199,129, Copy Not Enclosed.

Office Action dated Mar. 17, 2017 received in U.S. Appl. No. 15/198,992, copy not enclosed.

* cited by examiner

3D BONDED SEMICONDUCTOR STRUCTURE WITH AN EMBEDDED CAPACITOR

BACKGROUND

The present application relates to a semiconductor structure and a method of forming the same. More particularly, the present application relates to a three-dimensional (3D) bonded semiconductor structure having an embedded capacitor and having adequate bonding strength for the various bonding surfaces. The present application also relates to a method of forming such a 3D bonded semiconductor structure.

Three-dimensional (3D) integration is critical in current and in future technology development. Traditionally, oxide-oxide bonding is performed to physically connect two wafers and, thereafter, through-silicon-vias (TSVs) are formed to electrically connect the two wafers.

In the most advanced 3D integration technology development, oxide-oxide and metal-to metal bonding are performed simultaneously. Accordingly, oxide/oxide bonding strength and metal/metal contact are critical in order to meet the mechanical integrity requirement as well as the electrical performance. In existing semiconductor technology, there is no known method that provides a 3D semiconductor structure that has sufficient bonding strength between the various components of the semiconductor structures being bonded together.

SUMMARY

A first semiconductor structure including a first bonding oxide layer having a first metallic structure embedded therein and a second semiconductor structure including a second bonding oxide layer having a second metallic structure embedded therein are provided. A high-k dielectric material is formed on a surface of the first metallic structure. A nitride surface treatment process is performed to provide a nitrided surface layer to each structure. The nitrided surface layer includes nitridized oxide regions located in an upper portion of the bonding oxide layers and either a nitridized high-k dielectric material located in at least an upper portion of the high k dielectric material, or a nitridized metallic region located in an upper portion of the second metallic structure. The nitrogen within the nitridized metallic region is then selectively removed to restore the upper portion of the second metallic structure to its original composition. Bonding is performed to form a dielectric bonding interface between the nitridized oxide regions present in the first and second structures, and a bonding interface between the nitridized high-k dielectric material and the second metallic structure.

In one aspect of the present application, a three-dimensional bonded semiconductor structure is provided. In one embodiment of the present application, the three-dimensional bonded semiconductor structure includes a first semiconductor structure including a first wafer, a first interconnect structure, and a first bonding oxide layer containing first nitridized oxide regions and at least one nitridized high-k dielectric material embedded therein, wherein the at least one nitridized high-k dielectric material is present on a surface of a first metallic structure that is also embedded in the first bonding oxide layer. The three-dimensional bonded semiconductor structure also includes a second semiconductor structure including a second wafer, a second interconnect structure, and a second bonding oxide layer containing second nitridized oxide regions and at least one second metallic structure embedded therein, wherein a bonding interface is present between the first and second nitridized oxide regions and another bonding interface is present between the at least one nitridized high-dielectric material and the at least one second metallic structure. Collectively, the first metallic structure, the nitridized high-k dielectric material, and the second metallic structure form a capacitor that is embedded within the 3D semiconductor structure of the present application.

In another aspect of the present application, a method of forming a three-dimensional bonded semiconductor structure is provided. In one embodiment of the present application, the method may include providing a first semiconductor structure including a first wafer, a first interconnect structure, and a first bonding oxide layer containing at least one first metallic structure embedded therein, and a second semiconductor structure including a second wafer, a second interconnect structure, and a second bonding oxide layer containing at least one second metallic structure embedded therein. A high-k dielectric material is then formed on a surface of the at least one first metallic structure. A nitridation process is performed to provide a first nitrided surface layer comprising first nitridized oxide regions in an upper portion of the first bonding oxide layer and a nitridized high-k dielectric material in at least an upper portion of the high-k dielectric material, and to provide a second nitrided surface layer comprising second nitridized oxide regions in an upper portion of the second bonding oxide layer and a nitridized metallic region in an upper portion of the at least one second metallic structure. Nitrogen from the nitridized metallic region is removed to convert the nitridized metallic region into a region that has a same composition as the second metallic structure. The first semiconductor structure is then bonded to the second semiconductor structure, wherein the bonding provides a bonding interface between the first and second nitridized oxide regions and another bonding interface between the nitridized high-k dielectric material and the at least one second metallic structure.

DETAILED DESCRIPTION

Figure 1A:
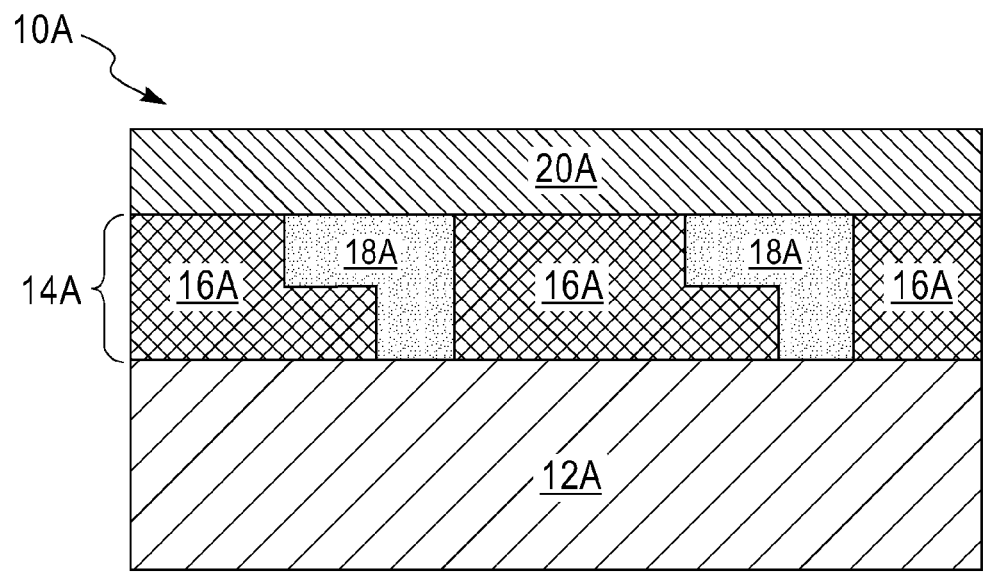
FIG. 1A is a cross sectional view of a first semiconductor structure including a first semiconductor wafer, a first interconnect structure, and a first bonding oxide layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1B:
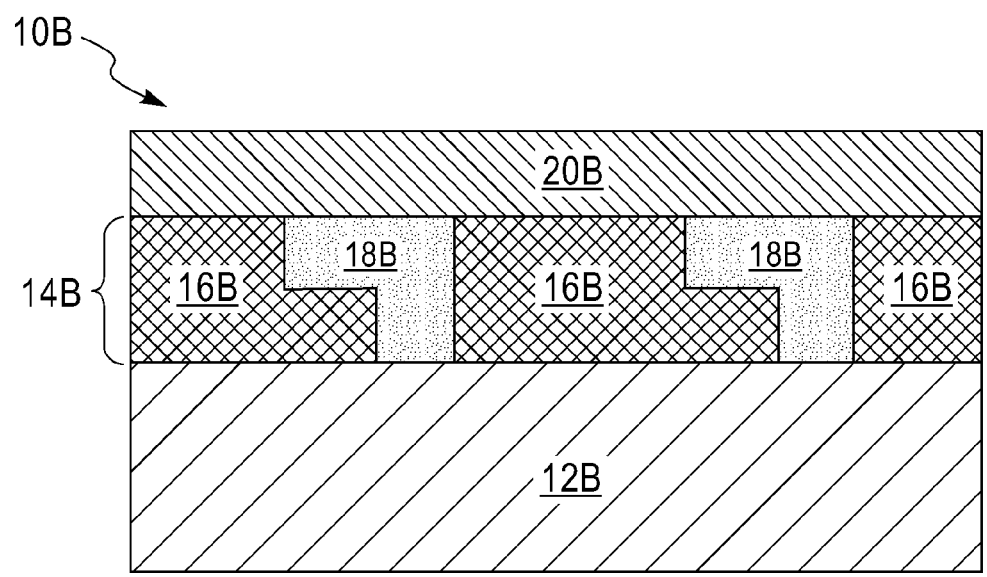
FIG. 1B is a cross sectional view of a second semiconductor structure including a second semiconductor wafer, a second interconnect structure, and a second bonding oxide layer.

Referring first to FIGS. 1A and 1B, there are shown a first semiconductor structure 10A and a second semiconductor structure 10B that can be employed in the present application. In the present application and following subsequent processing steps, the first and second structures (10A, 10B) will be bonded to each other.

The first semiconductor structure 10A includes a first semiconductor wafer 12A, a first interconnect structure 14A, and a first bonding oxide layer 20A. The first interconnect structure 14A includes at least one interconnect dielectric material 16A including one or more interconnect metallic structures 18A embedded therein. The second semiconductor structure 10B includes a second semiconductor wafer 12B, a second interconnect structure 14B, and a second bonding oxide layer 20B. The second interconnect structure 14B includes at least one interconnect dielectric material 16B including one or more interconnect metallic structures 18B embedded therein.

The first semiconductor wafer 12A and the second semiconductor wafer 12B both include a semiconductor substrate (not separately shown) having one or more semiconductor devices (also not separately shown) formed thereon. The semiconductor substrate that can be used as a component of the first and second semiconductor wafers (12A, 12B) may include a semiconductor material that has semiconducting properties. The semiconductor material that can provide the semiconductor substrate of the first and second semiconductor wafers (12A, 12B) may include, but is not limited to, silicon (Si), germanium (Ge), silicon germanium alloys (SiGe), silicon carbide (SiC), III-V compound semiconductors, II-VI compound semiconductors or multilayered combinations thereof. In some embodiments, the semiconductor material that provides the semiconductor substrate of the first semiconductor wafer 12A may be the same as a semiconductor material that provides the semiconductor substrate of the second semiconductor wafer 12B. In yet other embodiments, the semiconductor material that provides the semiconductor substrate of the first semiconductor wafer 12A may be different from the semiconductor material that provides the semiconductor substrate of the second semiconductor wafer 12B.

In some embodiments, the semiconductor substrate of the first and second semiconductor wafers (12A, 12B) may be a bulk crystalline substrate. The term "bulk" denotes the entirety of the crystalline substrate is composed of at least one crystalline material with no insulators and/or conductive materials present therein.

In yet other embodiments of the present application, the semiconductor substrate of the first and second semiconductor wafers (12A, 12B) may be a semiconductor-on-insulator (SOI) including, from bottom to top, a handle substrate, an insulator layer and a topmost crystalline semiconductor layer. In some embodiments, the handle substrate may be composed of one of the semiconductor materials mentioned above. In other embodiments, the handle substrate may be composed of a dielectric material or a conductive material. In yet other embodiments, the handle substrate may be omitted. The insulator layer of the SOI substrate may be composed of a dielectric oxide, dielectric nitride or a multilayered stack thereof. In one example, the insulator layer of the SOI substrate may be composed of silicon dioxide and/or silicon nitride. The topmost semiconductor layer of the SOI substrate may be composed of one of the semiconductor materials mentioned above. The SOI can be formed utilizing well known processes including, for example, a layer transfer process, or by a SIMOX (separation by ion implantation of oxygen) process.

The one or more semiconductor devices that can be present on the semiconductor substrate of the first and second semiconductor wafers (12A, 12B) may include, for example, transistors, capacitors, diodes, and/or resistors. The one or more semiconductor devices can be formed utilizing techniques that are well known in the semiconductor industry. For example, transistors may be formed utilizing a gate-first process or a gate-last process (also referred as to a replacement gate process). So as not to obscure the processing steps of the present application, the techniques used in forming the one or more semiconductor devices are not described herein in detail.

As mentioned above, the first semiconductor structure 10A includes a first interconnect structure 14A that contains at least one interconnect dielectric material 16A including one or more interconnect metallic structures 18A embedded therein, while the second semiconductor structure 10B includes a second interconnect structure 14B that includes at least one interconnect dielectric material 16B including one or more interconnect metallic structures 18B embedded therein.

The at least one interconnect dielectric material (16A, 16B) of the first and second interconnect structures (14A, 14B) may include any interlevel or intralevel dielectric including inorganic dielectrics or organic dielectrics. In one embodiment, the least one interconnect dielectric material (16A, 16B) of the first and second interconnect structures (14A, 14B) may be non-porous. In another embodiment, the least one interconnect dielectric material (16A, 16B) of the first and second interconnect structures (14A, 14B) may be porous. Some examples of suitable dielectrics that can be used as the least one interconnect dielectric material (16A, 16B) of the first and second interconnect structures (14A, 14B) include, but are not limited to, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

In some embodiments of the present application, the dielectric material of the at least one interconnect dielectric material 16A of the first interconnect structure 14A is the same as the dielectric material of the at least one interconnect dielectric material 16B of the second interconnect structure 14B. In other embodiments of the present application, the dielectric material of the at least one interconnect dielectric material 16A of the first interconnect structure 14A is different from the dielectric material of the at least one interconnect dielectric material 16B of the second interconnect structure 14B.

The at least one interconnect dielectric material (16A, 16B) of the first and second interconnect structures (14A, 14B) typically has a dielectric constant that is about 4.0 or less, with a dielectric constant of about 2.8 or less being more typical. All dielectric constants mentioned herein are relative to a vacuum, unless otherwise noted. These dielectrics generally have a lower parasitic cross talk as compared with dielectric materials that have a higher dielectric constant than 4.0. The thickness of the at least one interconnect dielectric material (16A, 16B) of the first and second interconnect structures (14A, 14B) may vary depending upon the type of dielectric material(s) used. In one example, the at least one interconnect dielectric material (16A, 16B) of the first and second interconnect structures (14A, 14B) may have a thickness from 50 nm to 1000 nm. Other thicknesses that are lesser than, or greater than, the aforementioned thickness range may also be employed in the present application for the thickness of the at least one interconnect dielectric material (16A, 16B) of the first and second interconnect structures (14A, 14B).

The at least one interconnect dielectric material (16A, 16B) of the first and second interconnect structures (14A, 14B) may be formed utilizing a deposition process such as, for example, chemical vapor deposition (CVD), plasma enhanced chemical vapor deposition (PECVD) or spin-on coating.

As mentioned above, one or more interconnect metallic structures 18A can be embedded in the at least one interconnect dielectric material 16A of the first interconnect structures 14A, and one or more interconnect metallic structures 18B can be embedded in the at least one interconnect dielectric material 16B of the second interconnect structures 14B. By "embedded" it is meant each metallic structure (18A, 18B) is contained within the at least one interconnect dielectric material (16A, 16B). As is shown, the topmost surface of each interconnect metallic structure (18A, 18B) is coplanar with a topmost surface of the at least one interconnect dielectric material (16A, 16B).

The one or more interconnect metallic structures (18A, 18B) are composed of copper (Cu), a copper-aluminum alloy (Cu—Al), a copper-manganese alloy (Cu—Mn), aluminum (Al), or an aluminum-copper alloy (Al—Cu). In the present application, the one or more interconnect metallic structures 18A are typically composed of a same interconnect metal (i.e., copper (Cu), a copper-aluminum alloy (Cu-Al), a copper-manganese alloy (Cu-Mn), aluminum (Al), or an aluminum-copper alloy (Al-Cu)) as the one or more interconnect metallic structures 18B.

The one or more interconnect metallic structures (18A, 18B) can be formed by first providing at least one opening into the at least one interconnect dielectric material (16A, 16B) and then filling the at least one opening with an interconnect metal or metal alloy as defined above.

The at least one opening can be formed utilizing a patterning process. In one embodiment, the patterning process may include lithography and etching. The lithographic process includes forming a photoresist (not shown) atop the at least one interconnect dielectric material (16A, 16B), exposing the photoresist to a desired pattern of radiation and developing the exposed photoresist utilizing a conventional resist developer. The photoresist may be a positive-tone photoresist, a negative-tone photoresist or a hybrid-tone photoresist. The etching process includes a dry etching process (such as, for example, reactive ion etching, ion beam etching, plasma etching or laser ablation), and/or a wet chemical etching process. Typically, reactive ion etching is used in providing the at least one opening.

The at least one opening that is formed may be a via opening, a line opening, and/or a combined via/line opening. In one embodiment, and when a combined via/line opening is formed, a via opening can be formed first and then a line opening is formed atop and in communication with the via opening. In another embodiment, and when a combined via/line opening is formed, a line opening can be formed first and then a via opening is formed atop and in communication with the line opening. In FIGS. 1A and 1B, and by way of an example, the at least one opening that houses each interconnect metallic structure (18A, 18B) is a combined via/line opening. When a via or line is formed, a single damascene process (including the above mentioned lithography and etching steps) can be employed. When a combined via/line is formed a dual damascene process (including at least one iteration of the above mentioned lithography and etching steps) can be employed.

Prior to forming the interconnect metal or metal alloy, a diffusion barrier (not show) can be optionally formed within the at least one opening. The diffusion barrier includes Ta, TaN, Ti, TiN, Ru, RuN, RuTa, RuTaN, W, WN or any other material that can serve as a barrier to prevent a conductive material from diffusing there through. The thickness of the diffusion barrier may vary depending on the deposition process used as well as the material employed. In some embodiments, the diffusion barrier may have a thickness from 2 nm to 50 nm; although other thicknesses for the diffusion barrier material are contemplated and can be employed in the present application. The diffusion barrier can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

In some embodiments, an optional plating seed layer (not specifically shown) can be formed on the surface of the diffusion barrier. In cases in which the conductive material to be subsequently and directly formed on the diffusion barrier, the optional plating seed layer is not needed. The optional plating seed layer is employed to selectively promote subsequent electroplating of a pre-selected conductive metal or metal alloy. The optional plating seed layer may be composed of Cu, a Cu alloy, Ir, an Ir alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the at least one opening. The thickness of the optional seed layer may vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, or PVD.

The interconnect metal or metal alloy is then formed into each opening utilizing a deposition process such as, for example, chemical vapor deposition (CVD), plasma enhanced chemical vapor deposition (PECVD), sputtering, chemical solution deposition or plating. In one embodiment, a bottom-up plating process is employed in forming the interconnect metal or metal alloy of each interconnect metallic structure (18A, 18B).

Following the deposition of the interconnect metal or metal alloy, a planarization process such as, for example, chemical mechanical polishing (CMP) and/or grinding, can be used to remove all interconnect metal or metal alloy (i.e., overburden material) that is present outside the at least one opening forming the structures shown in FIGS. 1A and 1B. The planarization stops on a topmost surface of the at least one interconnect dielectric material (16A, 16B) providing the coplanar structures illustrated in FIG. 1A-1B.

The first semiconductor wafer 12A also includes a first bonding oxide layer 20A present on the first interconnect structure 14A, while the second semiconductor wafer 12B also includes a second bonding oxide layer 20B present on the second interconnect structure 14B.

The first and second bonding oxide layers (20A, 20B) are composed of a same dielectric bonding oxide such as, for example, silicon dioxide, tetraethylorthosilicate (TEOS), or fluorinated tetraethylorthosilicate (FTEOS). The first and second bonding oxide layers (20A, 20B) can be formed by a deposition process such as, for example, chemical vapor deposition (CVD) or plasma enhanced chemical vapor deposition (PECVD). The first and second bonding oxide layers (20A, 20B) can have a thickness from 50 nm to 200 nm; although other thicknesses are not excluded from being used in the present application as the thickness of the first and second bonding oxide layers (20A, 20B).

Figure 2A:
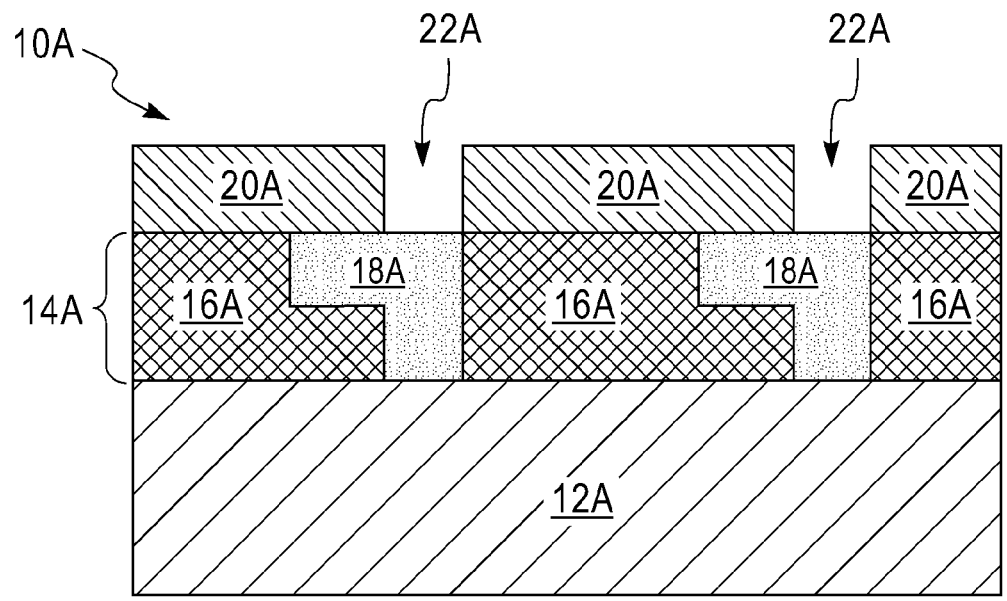
FIG. 2A is a cross sectional view of the first semiconductor structure of FIG. 1A after forming at least one first opening in the first bonding oxide layer.
Figure 2B:
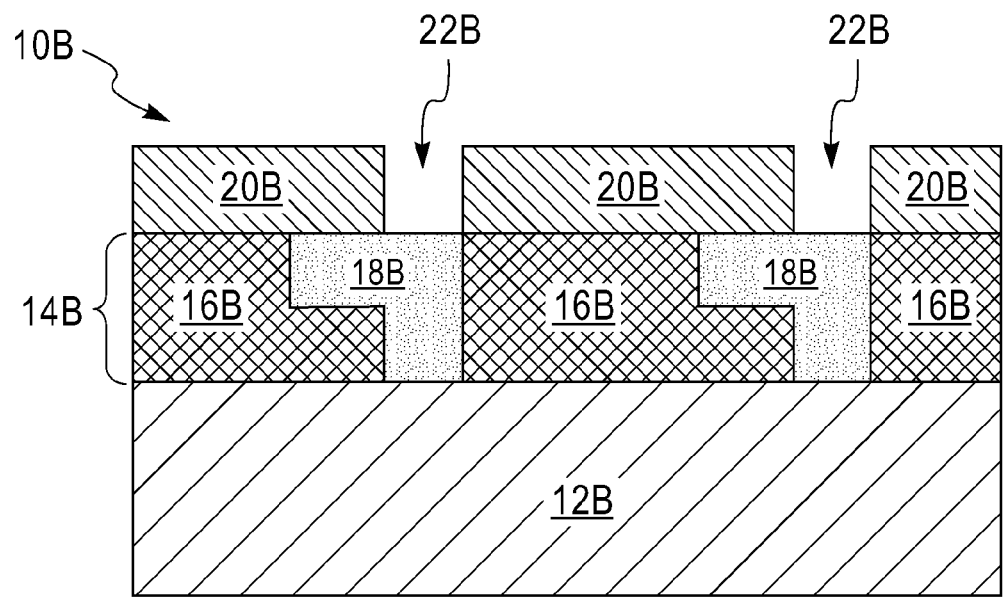
FIG. 2B is a cross sectional view of the second semiconductor structure of FIG. 1B after forming at least one second opening in the second bonding oxide layer.

Referring now to FIG. 2A-2B, there are shown the first semiconductor structure after forming at least one first opening 22A in the first bonding oxide layer 20A, and forming at least one second opening 22B in the second bonding oxide layer 20B. The first and second openings (22A, 22B) may be a via opening, a line opening or a combined line/via opening. In the present application, the first and second openings (22A, 22B) are shown as via openings. The first and second openings (22A, 22B) can be formed by lithography and etching as defined above in forming the openings in the at least one interconnect dielectric material (16A, 16B). The at least one first opening 22A exposes at least a portion of the topmost surface of at least one of the interconnect metallic structures 18A present in the at least one interconnect dielectric material 16A, while the at least second opening 22B exposes at least a portion of the topmost surface of at least one of the interconnect metallic structures 18B present in the at least one interconnect dielectric material 16B.

Figure 3A:
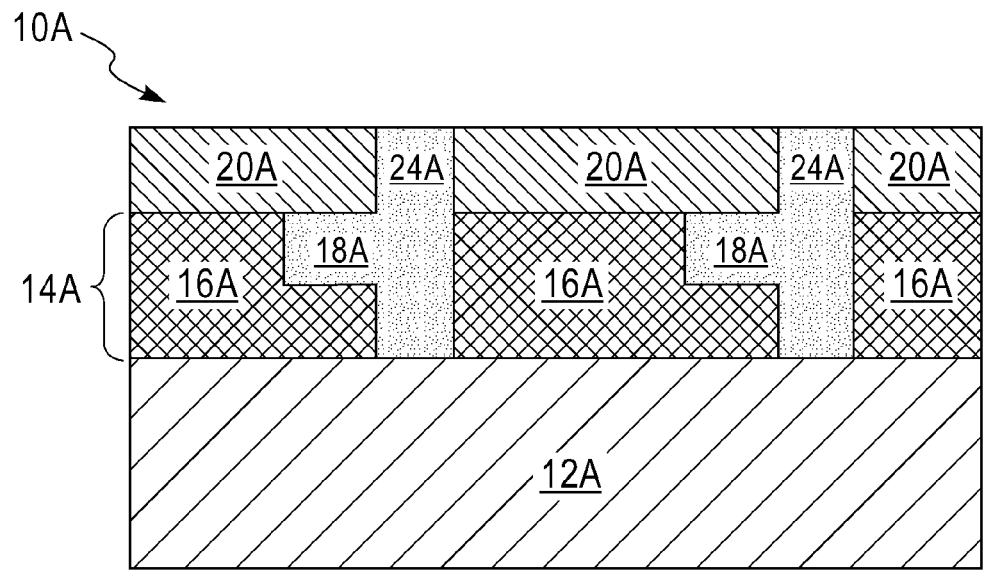
FIG. 3A is a cross sectional view of the first semiconductor structure of FIG. 2A after forming a first metallic structure in the at least one first opening.
Figure 3B:
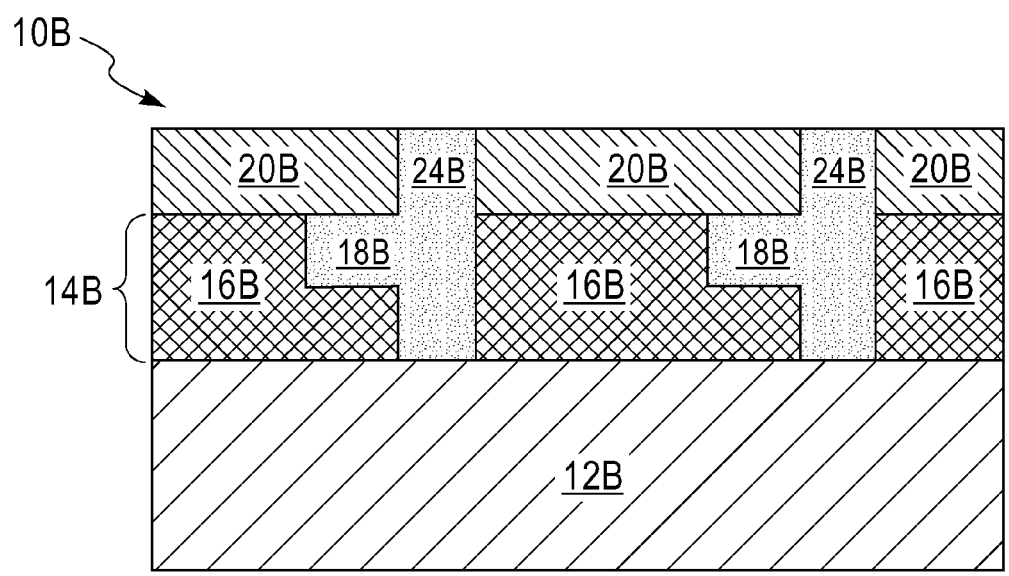
FIG. 3B is a cross sectional view of the second semiconductor structure of FIG. 2B after forming a second metallic structure in the at least one second opening.

Referring now to FIG. 3A, there is shown the first semiconductor structure after forming a first metallic structure 24A in the at least one first opening 22A, while FIG. 3B shows the second semiconductor structure after forming a second metallic structure 24B in the at least one second opening 22B. The number of first metallic structures 24A that is formed is determined by the number of first openings 22A formed into the first bonding oxide layer 20A, and the number of second metallic structures 24B that is formed is determined by the number of second openings 22B formed into the second bonding oxide layer 20B. The first and second metallic structures (24A, 24B) are composed of metal or metal alloy and will subsequently provide the capacitor plates of an embedded capacitor. The metal or metal alloy that provides the first and second metallic structures (24A, 24B) may include tantalum (Ta), tungsten (W), cobalt (Co), rhodium (Rh), ruthenium (Ru), aluminum (Al), copper (Cu) or alloys thereof. In one embodiment, the metal or metal alloy that provides the first metallic structure 24A is the same as a metal or metal alloy that provides the second metallic structure 24B. In another embodiment, the metal or metal alloy that provides the first metallic structure 24A is different from the metal or metal alloy that provides the second metallic structure 24B. The metal or metal alloy that provides the first and second metallic structures (24A, 24B) may be the same as, or different from the metal or metal alloy that provides the at least one interconnect structures (18A, 18B).

The first and second metallic structures (24A, 24B) can be formed by depositing the appropriate metallic material into the respective openings (22A, 22B) formed in the bonding oxide layer (20A, 20B). The deposition of the metallic material that provides the first and second metallic structures (24A, 24B) may include one of the deposition processes mentioned above for depositing the interconnect metal or metal alloy. A planarization process as defined above may be performed to provide the coplanar structures shown in FIGS. 3A-3B. Notably, as shown in FIG. 3A, each first metallic structure 24A has a topmost surface that is coplanar with a topmost surface of the first bonding oxide layer 20A, while and as shown in FIG. 3B, each second metallic structure 24B has a topmost surface that is coplanar with a topmost surface of the second bonding oxide layer 20B.

Figure 4:
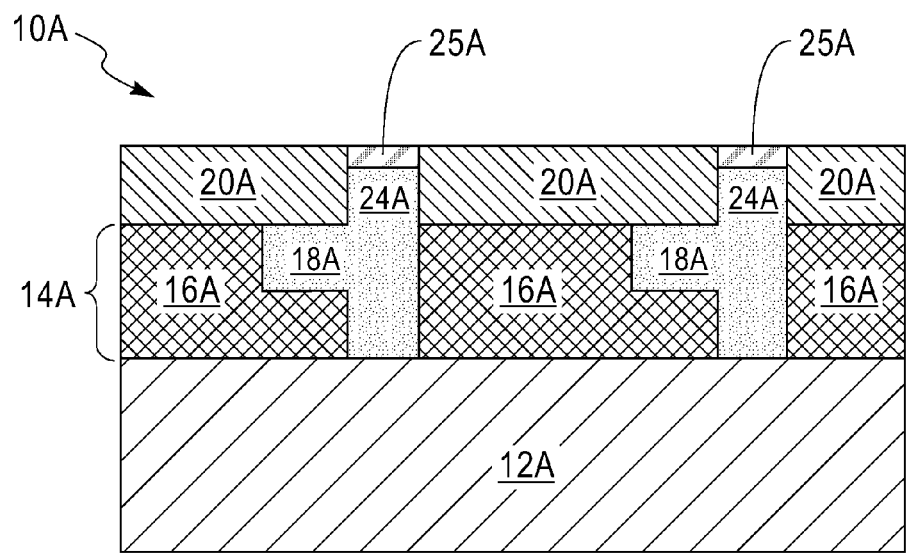
FIG. 4 is a cross sectional view of the first semiconductor structure after FIG. 3A after forming a high-k dielectric material on a surface of the first metallic structure.

Referring now to FIG. 4, there is shown the first semiconductor structure after forming a high-k dielectric material 25A on a surface of the first metallic structure 24A. The term "high-k dielectric material" is used in the present application to denote a dielectric material having a dielectric constant that is greater than the dielectric constant of silicon dioxide; the dielectric constant of silicon dioxide is typically about 3.9. The dielectric material that can be used to provide the high-k dielectric material 25A may include, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2.

The high-k dielectric material 25A can be formed by any deposition technique including, for example, chemical vapor deposition (CVD), plasma enhanced chemical vapor deposition (PECVD), physical vapor deposition (PVD), sputtering, or atomic layer deposition. In the present application, and prior to forming the high-k dielectric material, a block mask (not shown) is formed covering the topmost surface of the first bonding oxide layer 20A. A recess etch is then performed on the first semiconductor structure to lowering the height of the first metallic structure 24A within the first opening 22A; the recess etch may be omitted in embodiments in which the first metallic structure 24A is formed only partially within the at least one first opening 20A. The dielectric material that provides the high-k dielectric material 25A is then formed, and thereafter, the block mask is removed from the first semiconductor structure.

In some embodiments, it is possible to recess the second metallic structure 24B, but not the first metallic structure 24A. In such an embodiment, the high-k dielectric material 25A is formed on a non-recessed surface of the first metallic structure 24A.

At this point of the present application, the first and second structures shown in FIGS. 4 and 3B, respectively, (or any alternative structures) may be subjected to a pre-bake step. When employed, the pre-bake step can be performed at a temperature from 100° C. to 700° C. for a duration from 30 minutes to 4 hours and in a $N_2$ ambient or $N_2/H_2$ (i.e., a combined nitrogen and hydrogen) ambient. The pre-bake step readies the structures for a subsequently performed nitridation process.

Figure 5A:
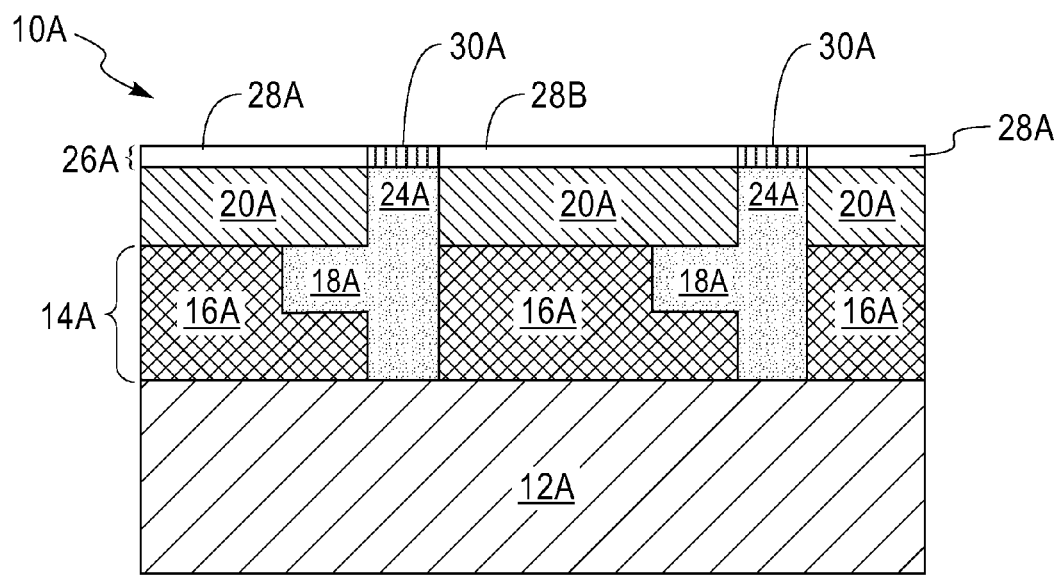
FIG. 5A is a cross sectional view of the first semiconductor structure of FIG. 4 after performing a nitridation process to provide a first nitrided surface layer containing first nitridized oxide regions and first nitridized high-k dielectric materials.
Figure 5B:
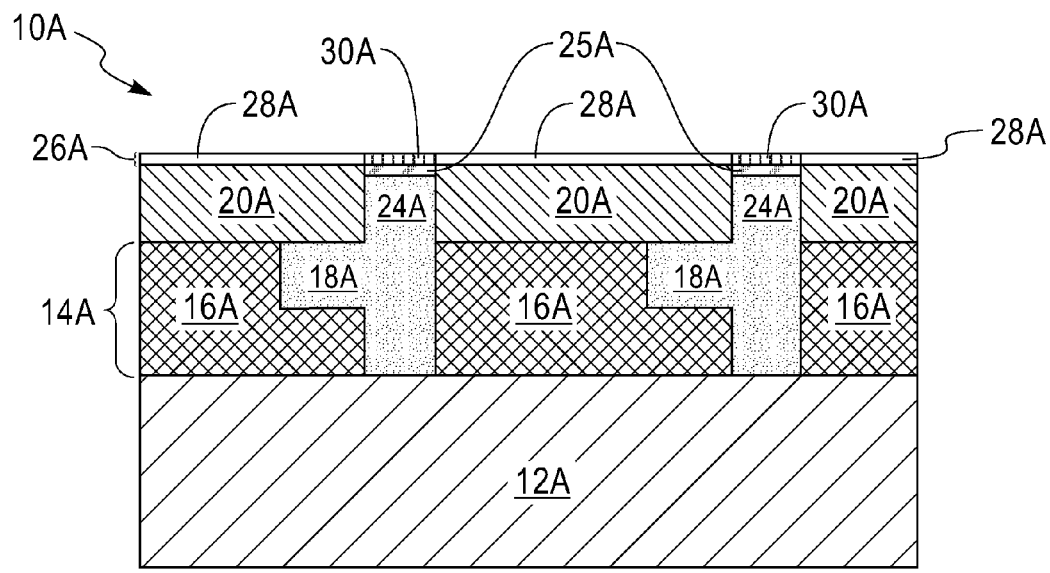
FIG. 5B is a cross sectional view of the first semiconductor after performing a nitridation process to provide a first nitrided surface layer containing first nitridized oxide regions and first nitridized high-k dielectric materials in accordance with another embodiment of the present application.
Figure 5C:
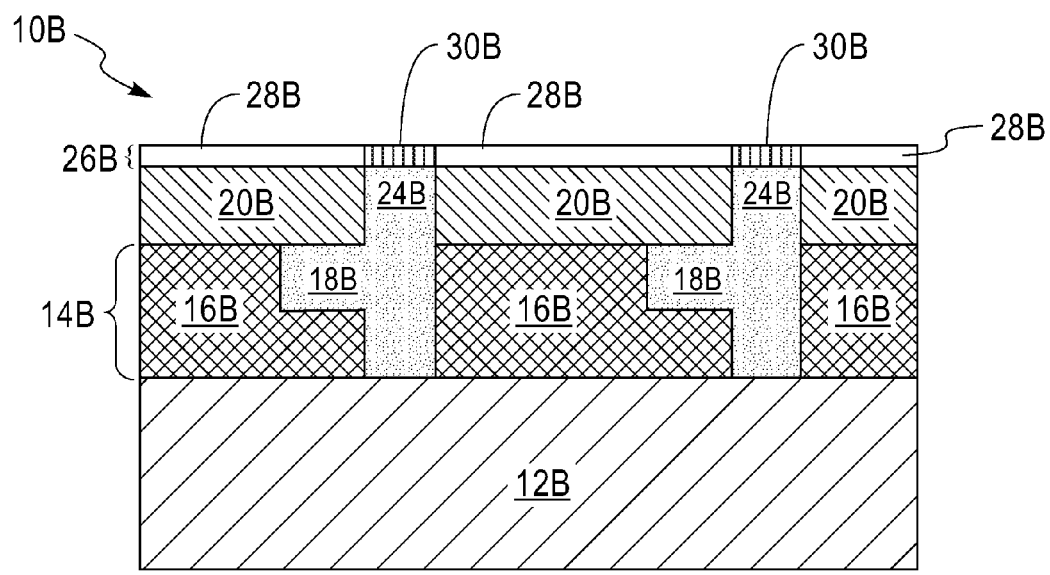
FIG. 5C is a cross sectional view of the first semiconductor structure of FIG. 3B after performing a nitridation process to provide a second nitrided surface layer containing second nitridized oxide regions and nitridized metallic regions.

Referring now FIGS. 5A-5B, there are illustrated the first semiconductor structure of FIG. 4 after performing a nitridation process to provide a first nitrided surface layer 26A containing first nitridized oxide regions 28A and nitridized high-k materials 30A, while FIG. 5C shows the second semiconductor structure of FIG. 3B after performing a nitridation process to provide a second nitrided surface layer 26B containing second nitridized oxide regions 28B and nitridized metallic regions 30B. In FIG. 5A, the nitridation consumes the entirety of the high-k dielectric material 25A, while in FIG. 5B, the nitridation only consumes a portion of the high-k dielectric material 25A. The nitridation process used to form the first and second nitrided surface layers (26A, 26B) is a surface treatment process in which the upper portion of the bonding oxide layer (20A, 20B), at least an upper portion of the high-k dielectric material 25A and the second metallic structures 24B are nitrided. Nitridation of the first and second semiconductor structures may be performed together or separately.

The first and second nitridized oxide regions (28A, 28B), which are formed into an upper portion of the respective bonding oxide layers (20A, 20B), may also be referred to herein as a nitrogen enriched oxide surface region. By "nitrogen enriched oxide surface region" it is meant, that the exposed upper portion of the bonding oxide layer (20A, 20B) has a higher nitrogen content therein after performing the nitridation process as compared to the originally deposited oxide bonding layer (20A, 20B).

The nitridized high-k dielectric material 30A, which is formed into at least an upper portion of the high-k dielectric material 25A, may also be referred to herein as a nitrogen enriched high-k dielectric portion. By "nitrogen enriched metallic portion" it is meant, that the exposed upper portion of the high-k dielectric material 25A has a higher nitrogen content therein after performing the nitridation process as compared to the originally formed high-k dielectric material 25A. The nitridized high-k dielectric material 30A may consume part of, or an entirety of the high-k dielectric material 25A.

The nitridized metallic regions 30B, which are formed into an upper portion of the second metallic structure 24B, may also be referred to herein as a nitrogen enriched metallic surface region. By "nitrogen enriched metallic surface region" it is meant, that the exposed upper portion of the second metallic structure 24B has a higher nitrogen content therein after performing the nitridation process as compared to the originally formed second metallic structure 24B.

In one embodiment, the nitridation process used in forming the first and second nitrided surface layers (26A, 26B) is a thermal nitridation process. The thermal nitridation process that is employed in the present application does not include an electrical bias higher than 200 W. In some embodiments, no electrical bias is performed during the thermal nitridation process. The thermal nitridation process employed in the present application is performed in any nitrogen-containing ambient, which is not in the form of a plasma. The nitrogen-containing ambients that can be employed in the present application include, but are not limited to, $N_2$, $NH_3$, $NH_4$, NO, or $NH_x$ wherein x is between 0 and 1. Mixtures of the aforementioned nitrogen-containing ambients can also be employed in the present application. In some embodiments, the nitrogen-containing ambient is used neat, i.e., non-diluted. In other embodiments, the nitrogen-containing ambient can be diluted with an inert gas such as, for example, helium (He), neon (Ne), argon (Ar) and mixtures thereof. In some embodiments, hydrogen ($H_2$) can be used to dilute the nitrogen-containing ambient.

Notwithstanding whether the nitrogen-containing ambient is employed neat or diluted, the content of nitrogen within the nitrogen-containing ambient employed in the present application is typically from 10% to 100%, with a nitrogen content within the nitrogen-containing ambient from 50% to 80% being more typical. In one embodiment, the thermal nitridation process employed in the present application is performed at a temperature from 50° C. to 500° C. In another embodiment, the thermal nitridation process employed in the present application is performed at a temperature from 80° C. to 300° C.

In addition to a thermal nitridation process, the formation of the first and second nitrided surface layers (26A, 26B) can include a plasma nitridation process. When a plasma nitridation process is employed, an electrical bias of greater than 200 W can be employed. The plasma nitridation process is performed by generating a plasma from one of the nitrogen-containing ambients that is mentioned above for the thermal nitridation process. In one embodiment, the plasma nitridation process employed in the present application is performed at a temperature from 50° C. to 500° C. In another embodiment, the plasma nitridation process employed in the present application is performed at a temperature from 80° C. to 300° C. In other embodiments, the nitrogen-containing ambient can be diluted with an inert gas such as, for example, helium (He), neon (Ne), argon (Ar) and mixtures thereof. In some embodiments, hydrogen ($H_2$) can be used to dilute the nitrogen-containing ambient.

Notwithstanding the type of nitridation employed, the depth of the first and second nitrided surface layers (26A, 26B) may vary. Typically, the depth of the first and second nitrided surface layers (26A, 26B), as measured from the topmost exposed surface of a material layer inward, is from 0.5 nm to 20 nm, with a depth from 1 nm to 10 nm being more typical. It is noted that the depth of the first and second nitrided surface layers (26A, 26B) includes the depth of each nitridized oxide region (28A, 28B), each nitridized-high k dielectric material 30A, and each nitridized metallic region 30B.

Each first and second nitridized oxide region (28A, 28B) is composed of a same oxide material as the bonding oxide layer (20A, 20B) with added nitrogen. In some embodiments, the nitrogen content of the first and second nitridized oxide regions (28A, 28B) is 10 atomic percent or greater. In one embodiment of the present application, the nitrogen content of the first and second nitridized oxide region (28A, 28B) can be from 10 atomic percent nitrogen to 50 atomic percent nitrogen. Nitrogen contents of less than 10 atomic percent are also contemplated.

Each nitridized metallic region 30B is composed of a same metallic material as the second metallic structure with added nitrogen, while the nitridized high-k dielectric material 30A is composed of same dielectric material as the high-k dielectric material 25A. In some embodiments, the nitrogen content of the high-k dielectric material 30A and the nitridized metallic region 30B is 10 atomic percent or greater. In one embodiment of the present application, the nitrogen content of the nitridized high-k dielectric material 30A, and the nitridized metallic region 30B can be from 10 atomic percent nitrogen to 50 atomic percent nitrogen. Nitrogen contents of less than 10 atomic percent are also contemplated.

Figure 6:
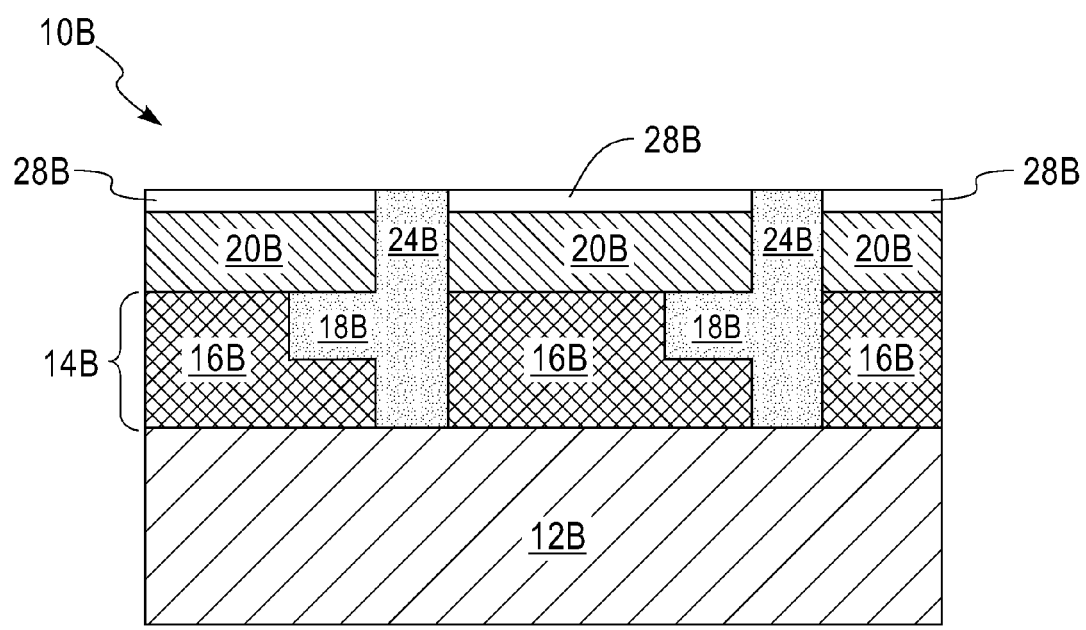
FIG. 6 is a cross sectional view of the second semiconductor structure of FIG. 5C after removing nitrogen from each of the nitridized metallic regions of the second nitrided surface layer.

Referring now to FIG. 6, there are illustrated the second semiconductor structure of FIG. 5C, after removing nitrogen from the nitridized metal region 30B. Nitrogen removal is not performed on the first semiconductor structure shown in FIG. 5A or FIG. 5B. Nitrogen removal from the nitridized metallic region 30B converts the nitridized metallic region 30B into a region that has a same composition as the second metallic structure 24B. That is, the nitridized metallic region 30B is converted back to the original metallic material of the original second metallic structure 24B. The converted region is not separately numbered since it has the same composition as the original second metallic structure 24B. For example, when the second metallic structure 24B is composed of Cu, the above mentioned surface treatment process forms nitrided copper (i.e., copper nitride) as the nitridized metallic region 30B, which after nitrogen removal converts the nitridized metallic region 30B back to copper.

The removal of nitrogen from the nitridized metallic region 30B is performed selective to the second nitridized oxide regions 28B; the bonding strength between nitrogen and the metal within the second nitridized metallic region 30B is weak, therefore a reduction can be selectively carried out on the second nitridized metallic region 30B. The removal may be performed in a gaseous or plasma ambient of hydrogen, helium or a mixture thereof. The removal may be performed at a temperature from 80° C. to 350° C. In the present application, all of the nitrogen is removed from the second nitridized metallic region 30B converting that region back into the original composition of the second metallic structure 24B. Little or no nitrogen is removed from the second nitridized oxide regions 28B since strong bonding exists between nitrogen and oxide within the second nitridized oxide region 28B.

Figure 7:
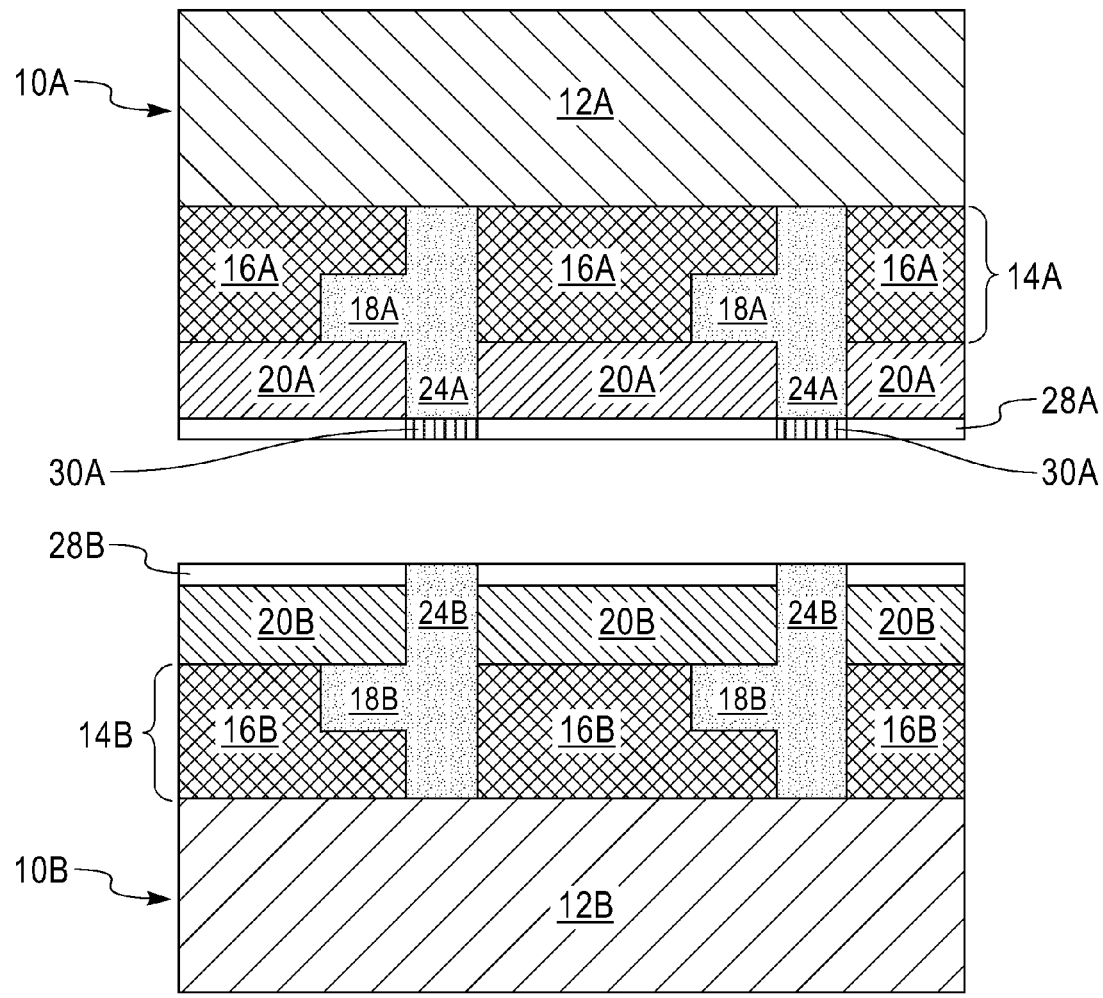
FIG. 7 is a cross sectional view of the first and second semiconductor structures of FIGS. 5A and 6 after performing a wafer to wafer alignment process.

Referring now to FIG. 7, there is shown the first and second semiconductor structures of FIGS. 5A and 6 after performing a wafer to wafer alignment process. Although the present application depicts wafer to wafer alignment of the structure shown in FIG. 5A with the structure shown in FIG. 6, the present application works when the structure shown in FIG. 5B is used instead of the structure shown in FIG. 5A. The wafer to wafer alignment process includes flipping one of the semiconductor structures upside down and placing the flipped semiconductor structure over the unflipped semiconductor structure such that the first nitridized oxide regions 28A are aligned with the second nitridized oxide regions 28B, and such that the nitridized high-k dielectric material 30A is aligned with one of the second metallic structures 24B. The wafer to wafer aligned may be performed by hand or by utilizing a robot arm.

Figure 8:
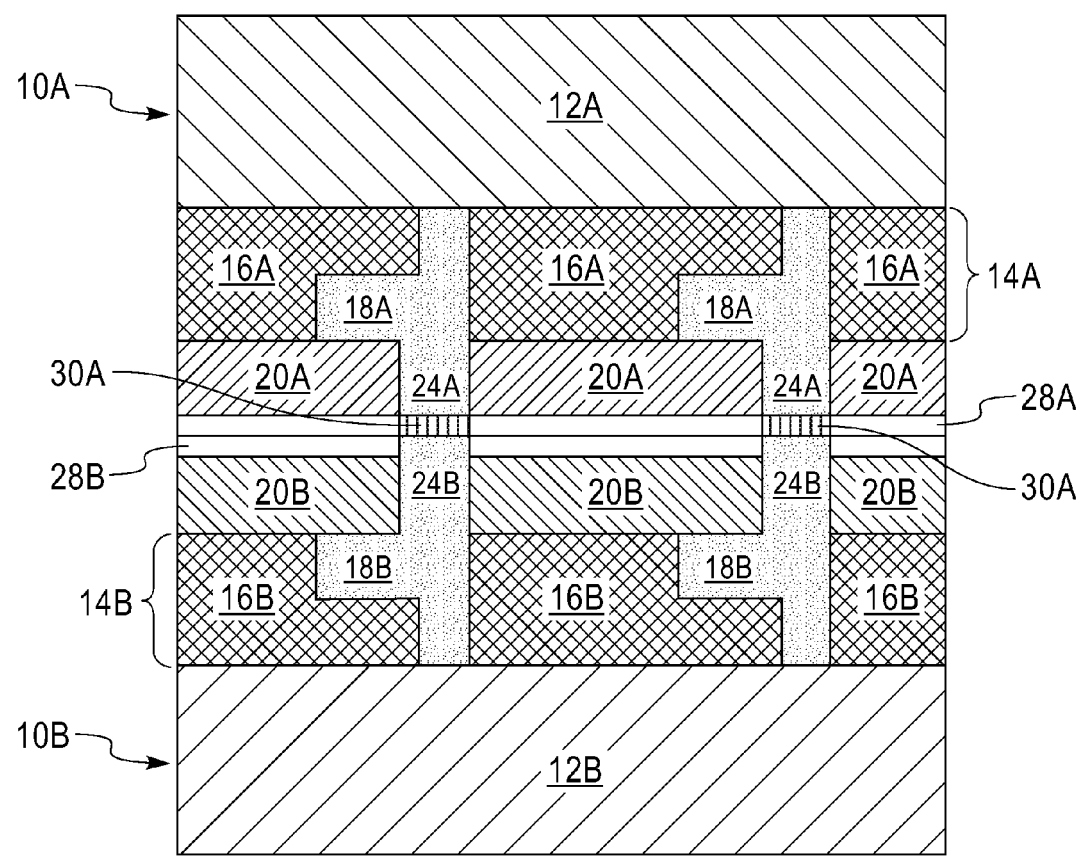
FIG. 8 is a cross sectional view of the first and second semiconductor structures of FIG. 7 after wafer bonding.

Referring now to FIG. 8, there is illustrated the first and second semiconductor structures of FIG. 7 after wafer bonding. Wafer bonding includes bring the two semiconductor structures in intimate contact with each other, with or without application of an external force, and thereafter performing a bonding anneal that permanently bonds the two structures to each other. The resulted structure maximizes the bonding strength for both the nitridized oxide regions (28A, 28B) and the nitridized high-k dielectric material 30A to second metallic structure 24B.

The bonding anneal may be performed at a temperature from 100° C. to 700° C. and in an ambient including nitrogen, hydrogen, helium or any mixtures thereof (i.e., nitrogen/helium or nitrogen/hydrogen or helium/hydrogen).

FIG. 8 illustrates a three-dimensional bonded semiconductor structure of the present application. The three-dimensional bonded semiconductor structure includes a first semiconductor structure 10A including a first wafer 12A, a first interconnect structure 14A, and a first bonding oxide layer 20A containing first nitridized oxide regions 28A and at least one nitridized high-k dielectric material 30A located on a surface of a first metallic structure 24A, wherein the first nitridized oxide region, the at least one nitridized high-k dielectric material 30A and the first metallic structure 24A are embedded in the first bonding oxide layer 20A. The three-dimensional bonded semiconductor structure also includes a second semiconductor structure 10B including a second wafer 12B, a second interconnect structure 14B, and a second bonding oxide layer 20B containing second nitridized oxide regions 28B and at least one second metallic structure 24B embedded therein, wherein a bonding interface is present between the first and second nitridized oxide regions (28A, 28B) and another bonding interface is present between the at least one nitridized high-dielectric material 30A and the at least one second metallic structure 24B. In some embodiments, and as shown, a non-nitridized high-k dielectric (i.e., high-k dielectric material 25A) is located between the nitridized high-k dielectric material 30A and the first metallic structure 24A. Collectively, the first metallic structure 24A, the nitridized high-k dielectric material 30B, if present, the high-k dielectric material 25A, and the second metallic structure 24B form a capacitor that is embedded within the 3D semiconductor structure of the present application. By "bonding interface" it is meant that the contacting surfaces of two materials are joined together by a chemical bond(s).

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A three-dimensional (3D) bonded semiconductor structure comprising:
   a first semiconductor structure including a first wafer, a first interconnect structure, and a first bonding oxide layer containing first nitridized oxide regions and at least one nitridized high-k dielectric material embedded therein, wherein said at least one nitridized high-k dielectric material is located on a surface of a first metallic structure which is also embedded in said first bonding oxide layer; and
   a second semiconductor structure including a second wafer, a second interconnect structure, and a second bonding oxide layer containing second nitridized oxide regions and at least one second metallic structure embedded therein, wherein a bonding interface is present between said first and second nitridized oxide regions and another bonding interface is present between a nitridized high-k dielectric material and said at least one second metallic structure.

2. The 3D bonded semiconductor structure of claim 1, wherein each of said first and second interconnect structures comprises at least one interconnect dielectric material and one or more interconnect metallic structures embedded therein.

3. The 3D bonded semiconductor structure of claim 2, wherein said at least one or more interconnect metallic structures are composed of copper, a copper-aluminum alloy, a copper manganese alloy, aluminum or an aluminum-copper alloy.

4. The 3D bonded semiconductor structure of claim 1, wherein a non-nitridized high-k dielectric material is located between said nitridized high-k dielectric material and said first metallic structure.

5. The 3D bonded semiconductor structure of claim 1, wherein said first and second metallic structures comprise tantalum, tungsten, cobalt, rhodium, ruthenium, aluminum, copper or alloys thereof.

6. The 3D bonded semiconductor structure of claim 1, wherein said first and second nitridized oxide regions comprise an oxide and added nitrogen.

7. The 3D bonded semiconductor structure of claim 6, wherein said added nitrogen is present in said first and second nitridized oxide regions in a content of from 10 atomic percent nitrogen to 50 atomic percent nitrogen.

8. The 3D bonded semiconductor structure of claim 1, wherein said at least one first metallic structure has a topmost surface that is recessed relative to a topmost surface of said first bonding oxide layer.

9. The 3D bonded semiconductor structure of claim 1, wherein said nitridized high-k dielectric material comprises $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, or an alloy thereof, wherein each value of x is independently from 0.5 to 3 and each value of y is independently from 0 to 2.

10. The 3D bonded semiconductor structure of claim 1, wherein said first metallic structure, said nitridized high-k dielectric material, and said second metallic structure provide an embedded capacitor.

* * * * *